(12) United States Patent
Sasaki et al.

(10) Patent No.: US 8,354,287 B2
(45) Date of Patent: *Jan. 15, 2013

(54) METHOD FOR MANUFACTURING ORGANIC ELECTROLUMINESCENCE DEVICE

(75) Inventors: Makoto Sasaki, Tsukuba (JP); Shinichi Morishima, Tsukuba (JP); Norihito Ito, Misato (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/670,566

(22) PCT Filed: Jul. 18, 2008

(86) PCT No.: PCT/JP2008/063022
§ 371 (c)(1),
(2), (4) Date: Jan. 25, 2010

(87) PCT Pub. No.: WO2009/016978
PCT Pub. Date: Feb. 5, 2009

(65) Prior Publication Data
US 2010/0210047 A1    Aug. 19, 2010

(30) Foreign Application Priority Data
Jul. 31, 2007 (JP) .................................. 2007-200102

(51) Int. Cl.
*H01L 21/00*    (2006.01)
(52) U.S. Cl. ................... 438/29; 438/127; 257/E21.366
(58) Field of Classification Search ..................... 438/63; 257/E21.053, E21.352, E21.365, E21.366
See application file for complete search history.

(56) References Cited

U.S. PATENT DOCUMENTS

| | | |
|---|---|---|
| 6,864,629 B2 | 3/2005 | Miyaguchi et al. |
| 2007/0054430 A1* | 3/2007 | Nishigaki .................. 438/29 |
| 2009/0001886 A1* | 1/2009 | Ibe et al. ................... 313/512 |
| 2009/0058268 A1 | 3/2009 | Yoshida et al. |
| 2010/0227422 A1* | 9/2010 | Sasaki et al. ............... 438/26 |

FOREIGN PATENT DOCUMENTS

| | | |
|---|---|---|
| JP | 2000-223264 A | 8/2000 |
| JP | 2002-033186 A | 1/2002 |
| JP | 2004-039530 A | 2/2004 |
| JP | 2006-221901 A | 8/2006 |
| JP | 2007-012410 A | 1/2007 |
| WO | 2007/037358 A1 | 4/2007 |

* cited by examiner

*Primary Examiner* — Cheung Lee
(74) *Attorney, Agent, or Firm* — Sughrue Mion, PLLC (57) ABSTRACT

The present invention provides a method for manufacturing an organic EL device. When an organic EL element which is composed of a pair of electrodes in which at least one of the electrodes is transparent or translucent, and an organic EL layer which comprises a light-emitting layer held between the electrodes, and a sealing layer which includes at least one layer of inorganic film being in contact with the organic EL element and which seals the organic EL element are formed on a substrate, a first sealing film which is included in the sealing layer and in contact with the organic EL element is formed by the facing target sputtering method, and the other inorganic film which is included in the sealing layer is formed by any method other than the facing target sputtering method.

4 Claims, 6 Drawing Sheets

METHOD FOR MANUFACTURING ORGANIC ELECTROLUMINESCENCE DEVICE

TECHNICAL FIELD

The present invention relates to a method for manufacturing an organic electroluminescence device. The term "electroluminescence" may be hereinafter abbreviated as EL in some cases.

BACKGROUND ART

An organic EL element is composed of a pair of electrodes and an organic EL layer sandwiched therebetween, at least one of the electrodes being transparent or translucent, and the organic EL layer including a light-emitting layer made from an organic light-emitting material. When a voltage is applied between the one pair of the electrodes of the organic EL element having such a structure, electrons are injected from a cathode into the light emitting layer, and holes are injected from an anode into the light emitting later and then they recombine in the light emitting layer. The light-emitting material in the light-emitting layer is excited by the energy generated at the time, and emits light in the light-emitting layer. An organic EL device mentioned herein is composed of the organic EL element formed on a substrate. For example, an organic EL device composed of an organic EL element formed on a planar substrate may be used as, for example, a planar light source, a segment display unit, or a dot matrix display device.

An organic EL element is deteriorated by exposure to water vapor or oxygen. As a countermeasure, for example, an anode, an organic EL layer including a light-emitting layer, and a cathode are sequentially stacked in this order on a substrate such as a glass substrate thereby producing an organic EL element, and then the whole of the organic EL element is covered with an inorganic passivation film composed of silicon nitride, and a resin sealing film composed of resin and formed on the surface of the inorganic passivation film, thus preventing deterioration of the organic EL element by exposure to water vapor (for example, see Patent Document 1). Here, the inorganic passivation film is formed by a plasma CVD (Chemical Vapor Deposition) method or sputtering method.

Patent Document 1: JP2000-223264 A

DISCLOSURE OF INVENTION

Problems to be Solved by the Invention

There are various sputtering methods to form conventional inorganic passivation films. In usual cases, a magnetron sputtering method achieving a high film formation rate is used. As described above, the magnetron sputtering method can form an inorganic passivation film at a high film formation rate, but the light-emitting layer in an organic EL element can be damaged by plasma emitted during film formation under the method. Also under other known CVD method such as plasma CVD method or thermal CVD method used for the formation of conventional inorganic passivation films, can form an inorganic passivation film at a high film formation rate, but the light-emitting layer in an organic EL element can be damaged by heat or plasma during film formation. As a result, luminescence properties of the light-emitting layer are deteriorated under these known methods of forming an inorganic passivation film.

The present invention has been accomplished in view of the above described problems, and is intended to provide a method for manufacturing an organic EL device with less damage to the organic EL element during formation of a film including an inorganic layer for sealing the organic EL element.

Means for Solving the Problem

In order to achieve the above object, the present invention provides a method for manufacturing an organic EL device having the following structure.

[1] A method for manufacturing an organic electroluminescence device composed of a supporting substrate and an organic electroluminescence element mounted thereon, the organic electroluminescence element being enclosed with the supporting substrate and a sealing layer including at least a first inorganic film and a second inorganic film configured to be cut off from the outside, the method comprising:

forming the first inorganic film by a facing target sputtering method configured to cover an exposed surface of the organic electroluminescence element mounted on the supporting substrate; and forming the second inorganic film by a film formation method different from the facing target sputtering method so as to cover the first inorganic film after the formation of the first inorganic film.

[2] The method for manufacturing an organic electroluminescence device according to the [1], wherein the film formation method different from the facing target sputtering method is a CVD method or a magnetron sputtering method.

[3] A method for manufacturing an organic electroluminescence device composed of a supporting substrate and an organic electroluminescence element mounted thereon, the organic electroluminescence element being enclosed with the supporting substrate and a sealing layer including at least a first inorganic film and a second inorganic film configured to be cut off from the outside, the method comprising:

forming the first inorganic film by a facing target sputtering method configured to cover the exposed surface of the organic electroluminescence element mounted on the supporting substrate; and forming the second inorganic film by a film formation method different from the facing target sputtering method to further cover the first inorganic film after the formation of the first inorganic film, wherein the second inorganic film is made from the same material as the first inorganic film.

[4] The method for manufacturing an organic electroluminescence device according to the [3], wherein the film formation method different from the facing target sputtering method is a CVD method or a magnetron sputtering method.

Effect of the Invention

According to the present invention, damage to an organic EL element caused during formation of a film sealing the organic EL element can be reduced compared to that caused under the magnetron sputtering method or the CVD method, thereby preventing deterioration of the luminescence properties of the organic EL element. As a result, the organic EL device having a longer lifetime can be obtained.

BRIEF DESCRIPTION OF THE DRAWINGS

FIG. 2-1 is a partial cross sectional view schematically depicting an example of the method for manufacturing an organic EL device in accordance with the present invention (part 1).

FIG. 2-2 is a partial cross sectional view schematically depicting an example of the method for manufacturing an organic EL device in accordance with the present invention (part 2).

FIG. 2-3 is a partial cross sectional view schematically depicting an example of the method for manufacturing an organic EL device in accordance with the present invention (part 3).

FIG. 4-1 is a partial cross sectional view depicting an example of the structure of a sealing layer.

FIG. 4-2 is a partial cross sectional view depicting an example of the structure of a sealing layer.

FIG. 4-3 is a partial cross sectional view depicting an example of the structure of a sealing layer.

| EXPLANATIONS OF LETTERS OR NUMERALS | |
|---|---|
| 10, 10A | supporting substrate |
| 20 | organic EL element |
| 21 | anode |
| 22 | organic EL layer |
| 23 | cathode |
| 30 | sealing layer |
| 31 to 35, 33A, 33B | sealing film |
| 36A, 36B, 36C | inorganic film |
| 37A, 37B | organic film |
| 38 | uppermost organic film |
| 100 | facing target sputtering device |
| 101 | vacuum chamber |
| 102 | substrate holder |
| 103 | target |
| 104 | target holder |
| 105 | vacuum pump |
| 106 | gas feeder |
| 107 | electrode |
| 108 | power source |
| 111 | ion |
| 112 | sputtered particles |

BEST MODES FOR CARRYING OUT THE INVENTION

Embodiments of the present invention will be further described below with reference to drawings. For easier understanding, the scale of the members in the drawings may be different from that of practical members. The present invention will not be limited to the following description, and may be modified without departing from the spirit and scope of the present invention. The organic EL device also includes members such as lead wires for the electrodes, but they are not depicted because they are not essential to the explanation of the present invention. For convenience to explain the layered structure or the like, the substrates are positioned down in the drawings of the following examples. However, the organic EL element of the present invention and the organic EL device having the organic EL element mounted thereon are not necessary to be placed in line with the up-down or right-left orientation depicted in the drawings for producing or using, and the orientation may be appropriately adjusted.

Figure 1:
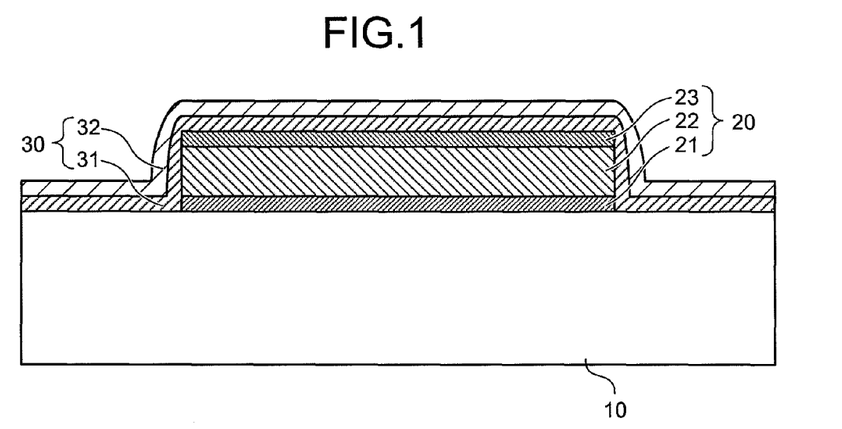
FIG. 1 is a partial cross sectional view schematically depicting an example of the structure of an organic EL device in accordance with the present invention.

FIG. 1 is a cross sectional view schematically depicting an example of the structure of an organic EL device according to the present invention. The organic EL device shown in FIG. 1 comprises a supporting substrate 10, an organic electroluminescence element 20, and a sealing layer 30. The organic electroluminescence element 20 comprises a pair of electrodes (21, 23) and an organic EL layer 22 held between the pair of electrodes (21, 23). The organic EL layer 22 has an organic light-emitting layer at least containing organic light-emitting material. In the organic EL device shown in FIG. 1, usually, the organic EL element 20 composed of the anode 21, the organic EL layer 22 including a light-emitting layer, and the cathode 23, which are stacked in this order, is formed on the supporting substrate 10. In the organic EL device shown in FIG. 1, a sealing layer 30 covers the whole of the organic EL element 20 formed on the supporting substrate 10, the organic EL element 20 is enclosed with the supporting substrate 10 and the sealing layer 30 so as to be cut off from the outside. The organic EL element shown in FIG. 1 is a top emission type organic EL device wherein light is emitted from the organic EL element 20 formed on the supporting substrate 10 at the side opposite to the supporting substrate 10.

Usable examples of the supporting substrate 10 may include various substrates such as glass, silicon, and plastic substrates. The anode 21 is usually a conductive metal oxide film or a translucent metal thin film with a relatively high work function (preferably greater than 4.0 eV). Specific usable examples of such film may include indium tin oxides (hereinafter referred to as ITOs), metal oxides such as tin oxide, metals such as gold (Au), platinum (Pt), silver (Ag), and copper (Cu), or alloys containing at least one of these metals, and organic transparent conductive films such as polyaniline or derivative thereof, or polythiophene or derivatives thereof. The anode 21 can be, as necessary, composed of two or more layers. The anode 21 may have any film thickness according to electric conductivity (and also optical permeability, when the device is of a bottom emission type). The thickness is, for example, from 10 nm to 10 μm, preferably from 20 nm to 1 μm, and more preferably from 50 nm to 500 nm. Examples of methods for forming the anode 21 may include a vacuum deposition method, sputtering method, an ion plating method, a plating method. When the device is of the top emission type, a reflection film for reflecting light emitted toward the substrate may be formed below the anode 21.

The organic EL layer 22 includes at least a light-emitting layer made from an organic substance. The light-emitting layer contains an organic substance (low molecular compound or macromolecular compound) emitting fluorescence or phosphorescence, and may further contain a dopant material. Examples of the organic substance may include dye materials, metal complex materials, and polymer materials. The dopant material is doped to the organic substance as necessary, according to the purposes such as the improvement of the organic luminous efficiency and the shift of the emission wavelength of the organic substance. The thickness of the light-emitting layer made from the organic substance and the optionally doped dopant is usually from 20 to 2,000 angstroms.

(Dye Materials)

Examples of dye materials may include cyclopentamine derivatives, tetraphenyl butadiene derivative compounds, triphenylamine derivatives, oxadiazole derivatives, pyrazoloquinoline derivatives, distyryl benzene derivatives, distyryl arylene derivatives, pyrrole derivatives, thiophene cyclic compounds, pyridine cyclic compounds, perinone derivatives, perylene derivatives, oligothiophene derivatives, trifumanylamine derivatives, oxadiazole dimers, and pyrazoline dimers.

(Metal Complex Materials)

Examples of metal complex materials may include metal complexes which emits light from the triplet excited state, such as iridium complexes and platinum complexes; and metal complexes such as alumiquinolinol complexes, benzoquinolinol beryllium complexes, benzoxazolyl-zinc complexes, benzothiazole-zinc complexes, azomethyl-zinc complexes, porphyrin-zinc complexes, and europium complexes, which include aluminum (Al), zinc (Zn), beryllium (Be) or the like, or a rare earth metal such as terbium (Tb), europium (Eu), dysprosium (Dy), as a central metal, and oxadiazole, thiadiazole, phenylpyridine, phenylbenzoimidazole, quinoline, as a ligand.

(Polymer Materials)

Examples of the polymer-based material include polyparaphenylene vinylene derivatives, polythiophene derivatives, polyparaphenylene derivatives, polysilane derivatives, polyacetylene derivatives, polyfluorene derivatives, polyvinylcarbazole derivatives, and polymers of the above described dyes and metal complex light-emitting materials.

Among the light-emitting materials, examples of those material emitting blue light may include distyryl arylene derivatives, oxadiazole derivatives and polymers thereof, polyvinylcarbazole derivatives, polyparaphenylene derivatives, polyfluorene derivatives, quinacridone derivatives, and coumarin derivatives. Among them, polymer materials such as polyvinylcarbazole derivatives, polyparaphenylene derivatives and polyfluorene derivatives are preferred.

Examples of materials emitting green light include quinacridone derivatives, coumarin derivatives and polymers thereof, polyparaphenylene vinylene derivatives, and polyfluorene derivatives. Among them, polymer materials such as polyparaphenylene vinylene derivatives and polyfluorene derivatives are preferred.

Examples of materials emitting red light include coumarin derivatives, thiophene cyclic compounds and polymers thereof, polyparaphenylene vinylene derivatives, polythiophene derivatives, and polyfluorene derivatives. Among them, polymer materials such as polyparaphenylene vinylene derivatives, polythiophene derivatives, and polyfluorene derivatives are preferred.

(Dopant Materials)

Examples of dopant materials may include perylene derivatives, coumarin derivatives, rubrene derivatives, quinacridone derivatives, squarylium derivatives, porphyrin derivatives, styryl-based dyes, tetracene derivatives, pyrazolone derivatives, decacyclene, and phenoxazon.

The organic EL layer 22 can further include, in addition to the light-emitting layer, other layers between the light-emitting layer and the anode 21, and between the light-emitting layer and the cathode 23. Examples of the layers provided between the light-emitting layer and the anode 21 may include a hole injection layer for improving the efficiency of hole injection from the anode 21, and a hole transport layer for improving hole injection from the anode 21 or the hole injection layer into the light-emitting layer. Examples of the layers provided between the light-emitting layer and the cathode 23 may include an electron injection layer for improving the efficiency of electron injection from the cathode 23, and an electron transport layer for improving electron injection from the cathode 23, electron injection layer, or another electron transport layer closer to the cathode 23.

(Hole Injection Layer)

Examples of materials constituting the hole injection layer may include phenylamines, starburst amines, phthalocyanines, oxides such as vanadium oxides, molybdenum oxides, ruthenium oxides and aluminum oxides, amorphous carbon, polyaniline, and polythiophene derivatives.

(Hole Transport Layer)

Examples of the material composing the hole transport layer may include polyvinylcarbazole or derivatives thereof, polysilane or derivatives thereof, polysiloxane derivatives having aromatic amine in the side or main chain, pyrazoline derivatives, arylamine derivatives, stilbene derivatives, triphenyldiamine derivatives, polyaniline or derivatives thereof, polythiophene and derivatives thereof, polyarylamine or derivatives thereof, polypyrrole or derivatives thereof, poly (p-phenylene vinylene) or derivatives thereof, or poly(2,5-thienylene vinylene) or derivatives thereof.

When the hole injection layer or hole transport layer has an ability of blocking the electron transportation, the hole transport layer or hole injection layer may be referred to as an electron block layer.

(Electron Transport Layer)

The electron transport layer may be composed of a known material. Examples of the materials may include oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyl dicyanoethylene or derivatives thereof, diphenoquinone derivatives, and metal complexes of 8-hydroxyquinoline or derivatives thereof, polyquinoline and derivatives thereof, polyquinoxaline or derivatives thereof, and polyfluorene or derivatives thereof.

(Electron Injection Layer)

The electron injection layer may be composed of, according to the type of the light-emitting layer, a single layer of Ca layer, or a stacked layer including a Ca layer and another layer composed of one or more materials selected from the group consisting of Group IA and IIA metals in the periodic table excluding Ca which have a work function of 1.5 to 3.0 eV, and oxides, halides and carbonates thereof. Examples of the Group IA metal in the periodic table which have a work function of 1.5 to 3.0 eV, and oxides, halides, and carbonates thereof may include lithium, lithium fluoride, sodium oxide, lithium oxide, and lithium carbonate. Examples of the Group IIA metal in the periodic table excluding Ca which have a work function of 1.5 to 3.0 eV, and oxides, halides and carbonates thereof may include strontium, magnesium oxide, magnesium fluoride, strontium fluoride, barium fluoride, strontium oxide, and magnesium carbonate.

When the electron transport layer or electron injection layer has an ability of blocking the hole transportation, the electron transport layer or electron injection layer may be referred to as a hole block layer.

The cathode 23 is preferably a transparent or translucent material which has a relatively low work function (preferably lower than 4.0 eV), and readily injects electrons into the light-emitting layer. Examples of such materials may include metals such as lithium (Li), sodium (Na), potassium (K), rubidium (Rb), cesium (Cs), Be, magnesium (Mg), calcium (Ca), strontium (Sr), barium (Ba), Al, scandium (Sc), vanadium (V), Zn, yttrium (Y), indium (In), cerium (Ce), samarium (Sm), Eu, Tb, and ytterbium (Yb); alloys composed of two or more of these metals; alloys composed of one or more of these metals and one or more metals selected from Au, Ag, Pt, Cu, manganese (Mn), titanium (Ti), cobalt (Co), nickel (Ni), tungsten (W), and tin (Sn); graphite or graphite intercalation compounds; and metal oxides such as ITO and tin oxide.

The cathode 23 may have a stacked structure composed of two or more layers. The stacked structure may be composed of a metal such as Al, Ag, or chromium (Cr) and any of the above-described metals, metal oxides, fluorides or alloys thereof. The cathode 23 may have any film thickness according to electric conductivity and durability. The thickness is, for example, from 10 nm to 10 µm, preferably from 20 nm to 1 µm, and more preferably from 50 nm to 500 nm. The method for forming the cathode 23 may be, for example, vacuum deposition method, sputtering method, or lamination method in which a metal thin film is bonded by thermocompression.

The layers provided between the light-emitting layer and anode 21, and between the light-emitting layer and cathode 23 may be selected according to the performance required of the organic EL device to be made. For example, the organic EL element 20 used in the present invention may have any of the following layered structures (a) to (o):

(a) anode/hole transport layer/light-emitting layer/cathode
(b) anode/light-emitting layer/electron transport layer/cathode
(c) anode/hole transport layer/light-emitting layer/electron transport layer/cathode
(d) anode/hole injection layer/light-emitting layer/cathode
(e) anode/light-emitting layer/electron injection layer/cathode
(f) anode/hole injection layer/light-emitting layer/electron injection layer/cathode
(g) anode/hole injection layer/hole transport layer/light-emitting layer/cathode
(h) anode/hole transport layer/light-emitting layer/electron injection layer/cathode
(i) anode/hole injection layer/hole transport layer/light-emitting layer/electron injection layer/cathode
(j) anode/hole injection layer/light-emitting layer/electron transport layer/cathode
(k) anode/light-emitting layer/electron transport layer/electron injection layer/cathode
(l) anode/hole injection layer/light-emitting layer/electron transport layer/electron injection layer/cathode
(m) anode/hole injection layer/hole transport layer/light-emitting layer/electron transport layer/cathode
(n) anode/hole transport layer/light-emitting layer/electron transport layer/electron injection layer/cathode
(o) anode/hole injection layer/hole transport layer/light-emitting layer/electron transport layer/electron injection layer/cathode (Symbol "/" indicates that the layers are adjacent to each other and stacked. The same applies below.)

In the layered structures (a) to (o), either embodiment in which the anode is provided at the side closer to the substrate or embodiment in which cathode is provided at the side closer to the substrate may be employed.

The sealing layer 30 is a layer having the high barrier property against gases such as water vapor and oxygen for the purpose of preventing the gases from being in contact with the organic EL element, and is provided for sealing the organic EL element. The sealing layer includes an inorganic film. In the present embodiment, the sealing layer 30 comprises first and second inorganic films, in which at least the first inorganic film is in contact with the organic EL element 20. The sealing layer 30 includes at least one layer of inorganic film, and is preferably a continuous dense film having no defect such as pinholes. Examples of the inorganic film of the sealing layer 30 may include single films such as an SiN, SiO, SiON, and $Al_2O_3$ films or stacked films thereof, and stacked films composed of these films and organic films such as acrylic monomers. In the present embodiment, the sealing layer 30 is composed of the first sealing film 31 (first inorganic film) formed on the supporting substrate 10 side, and the second sealing film 32 which is composed of the same material as the first sealing film 31 (second inorganic film) and formed by a different method from that for the first sealing film 31. Alternatively, the first sealing film 31 and the second sealing film 32 may be composed of different materials.

Figure 21:
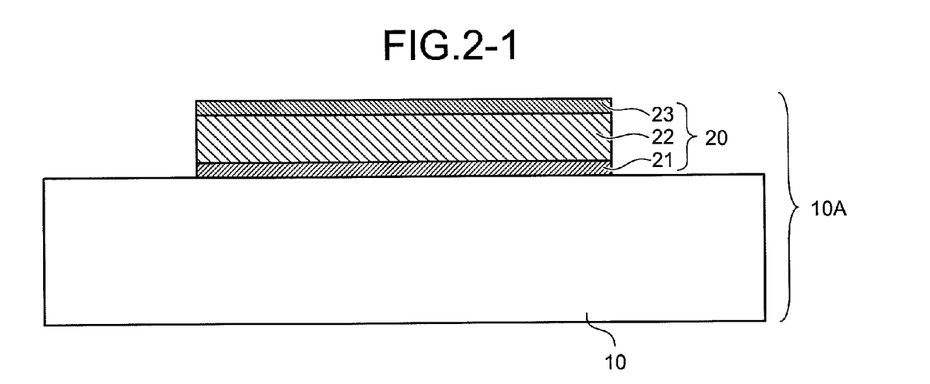
Figure 22:
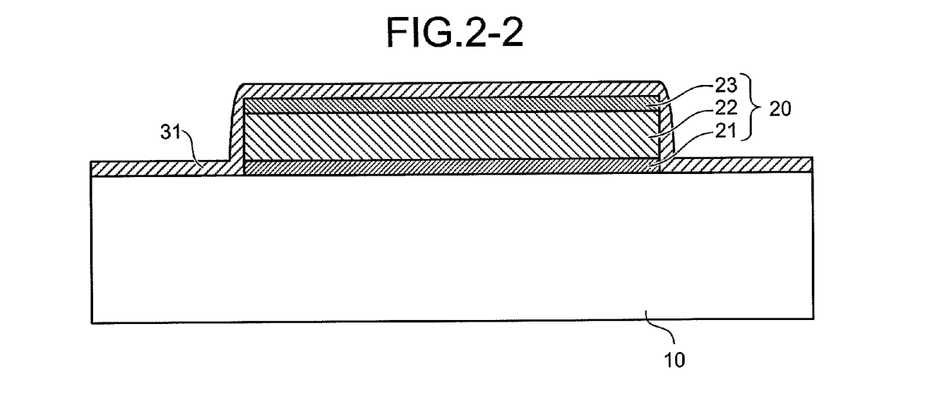
Figure 23:
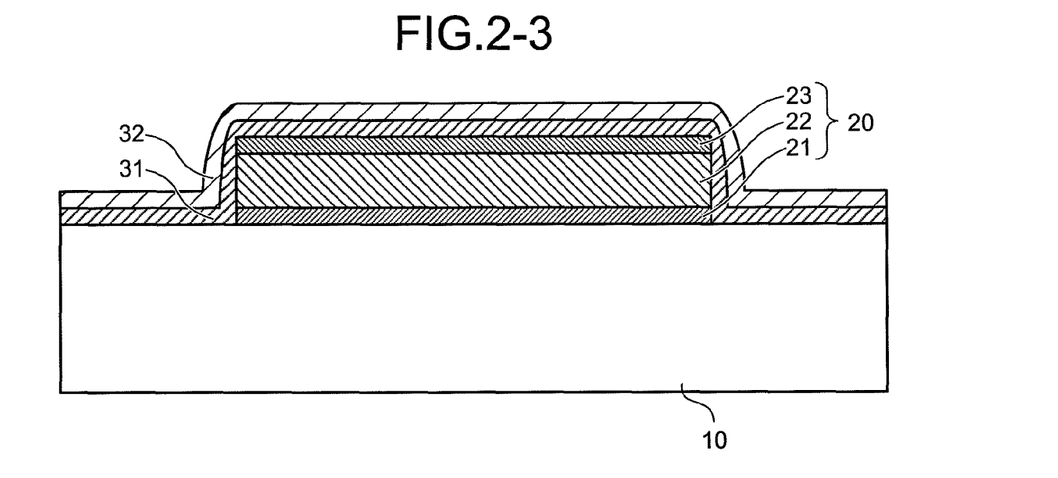

The method for manufacturing an organic EL device having the above structure is described below. FIGS. 2-1 to 2-3 schematically depict examples of the method for manufacturing an organic EL device according to the present invention. First, the anode 21, the organic EL layer 22 including a light-emitting layer, and the cathode 23, each of which has a predetermined patterned shape, are sequentially formed in this order by a known method on the supporting substrate 10 such as a glass substrate, thus producing the organic EL element 20 (FIG. 2-1). For example, when the organic EL device is used as a dot matrix display device, banks (not depicted) for dividing the light-emitting region into matrices are formed, and the organic EL layer 22 including a light-emitting layer is formed in the regions surrounded by the banks.

Second, the first sealing film 31 having a predetermined thickness is formed by a facing target sputtering method on the supporting substrate 10 having the organic EL element 20 (FIG. 2-2). The facing target sputtering method is a kind of sputtering method. The sputtering method refers to a method of forming a thin film, in which fine particles of a target material (thin film material) are ejected into the gas phase by bombarding the target material with fine particles of an atom or molecular size, and deposited on the surface of a predetermined substrate to form a thin film. In a more limited sense, the term "sputtering" may refer to ejection of fine particles of a target material into the gas phase due to bombardment of the target material by fine particles of an atom or molecular size.

The thickness of the first sealing film 31 is preferably at least 50 nm or more. This is because if the thickness of the first sealing film 31 is smaller than 50 nm, the organic EL element 20 can be damaged during formation of the second sealing film 32 by any method other than the facing target sputtering method, so that its lifetime becomes almost the same as that of the conventional organic EL element 20. The first sealing film 31 having a thickness of 50 nm or more can reduce the damage to the organic EL element 20 caused during formation of the second sealing film 32 by any film formation method other than facing target sputtering method, such as a magnetron sputtering method or a CVD method, thus effectively improving the lifetime of the device. The thickness of the first sealing film 31 may be greater than 50 mm, but formation of such a thick film by facing target sputtering method takes a long time. Therefore, the thickness of the first sealing film 31 is appropriately selected according to the time to be spent for manufacturing the organic EL device.

Figure 3:
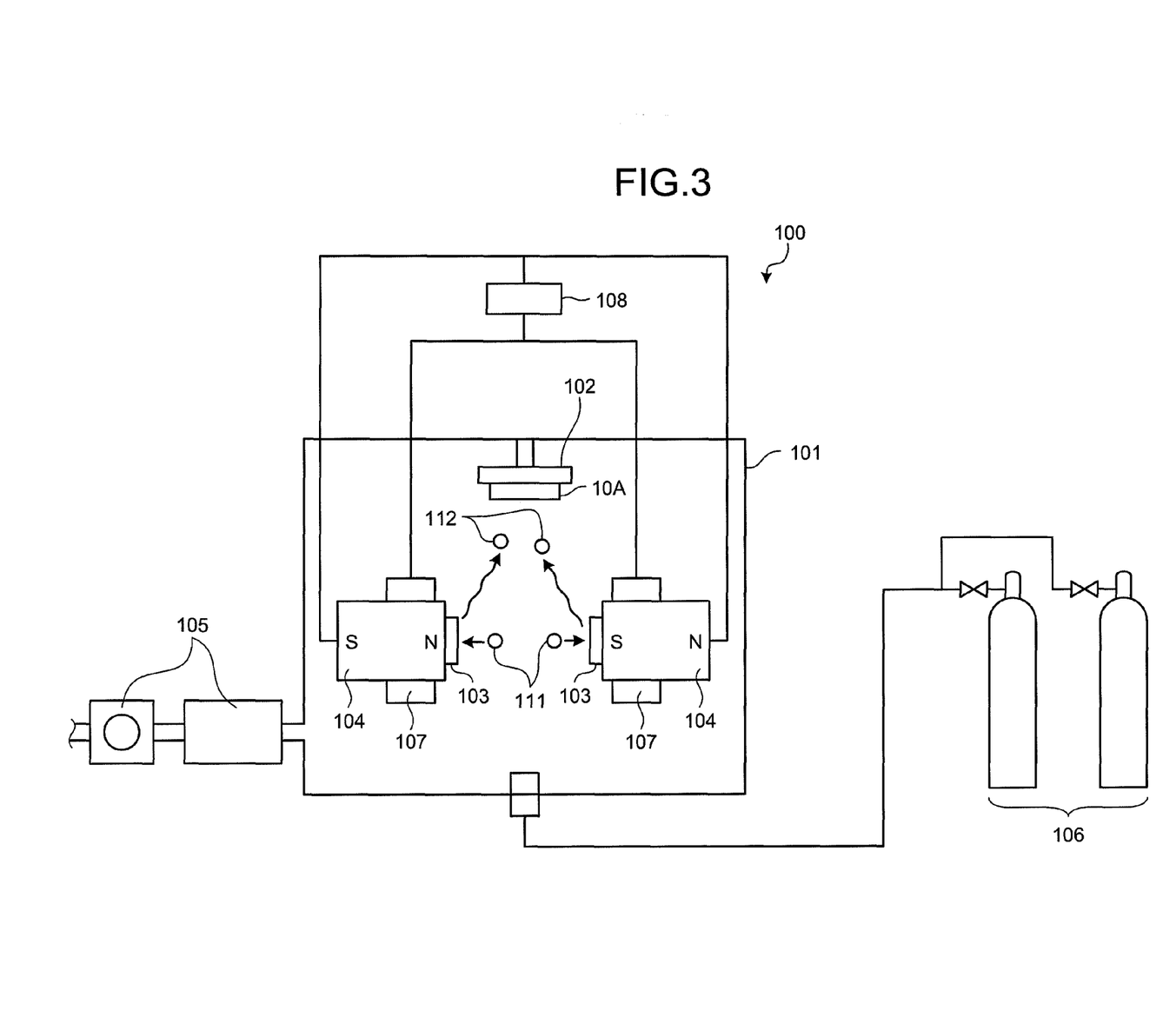
FIG. 3 is a diagram schematically depicting the structure of a facing target sputtering device.

FIG. 3 schematically depicts the structure of a facing target sputtering device. As shown in FIG. 3, the facing target sputtering device 100 has a vacuum chamber 101, and comprises therein: the substrate holder 102 holding a supporting substrate 10 (a supporting substrate 10A having the organic EL element 20); the targets 103 being composed of the material to form the first sealing film 31 or a portion of the material; the target holders 104 each holding the respective targets 103 so that the targets 103 face each other, and each including a permanent magnet for applying a direct current magnetic field to the region between the targets 103; the vacuum pump 105 evacuating the vacuum chamber 101 so as to give a predetermined degree of vacuum; and the gas feeding unit 106 feeding any predetermined gas into the vacuum chamber 101 during film formation. The substrate holder 102 is disposed outside the region between the two target holders 104 in such a manner that the substrate faces the region between the target holders 104. An electrode 107 is provided on each of the target holders 104 on the side where the target 103 is held, and the target holders 104 and the electrodes 107 are connected to a power source 108. For example, when the first sealing film 31 is composed of SiO film, the target 103 is composed of bulk SiO or Si. When an Si target is used, gas such as oxygen is fed from a gas feeding unit 106 into the vacuum chamber 101 so as to deposit an SiO film on the surface of the supporting substrate 10A held by the substrate holder 102. Such manner is also carried out for forming the first sealing film 31 with other material.

In the facing target sputtering device 100, the supporting substrate 10A is held by the substrate holder 102, the vacuum pump 105 evacuates the vacuum chamber 101 to a predetermined degree of vacuum, and then argon gas (or any other gas as necessary) is fed from the gas feeding unit 106 into the vacuum chamber 101. Upon application of a predetermined voltage by the power source 108 to the region between the target holder 104 and the electrode 107, plasma is generated between the targets 103 which are oppositely disposed each other. The plasma is generated in a columnar manner and with a high density in the narrow region between the opposed targets 103 by the electric field and direct current magnetic field generated during the film formation. The ions 111 in the plasma are accelerated by the voltage applied to the target holder 104, bumped against the target 103, whereby the particles composing the target are sputtered. A portion of the sputtered particles 112 reaches the surface of the supporting substrate 10A, and is deposited thereon to form a film (the first sealing film 31) on the organic EL element 20.

As described above, plasma is confined in the region between the opposed targets 103 during film formation, thus preventing the supporting substrate 10A from exposure to the plasma. As a result, the light-emitting layer of the organic EL element 20 will not be damaged by the plasma.

Thereafter, the second sealing film 32 having an predetermined thickness is formed on the first sealing film 31 by any film formation method other than facing target sputtering method, such as the CVD method or the magnetron sputtering method (FIG. 2-3). The formation of the second sealing film 32 can employ any method which achieves a higher film formation rate than facing target sputtering method. Through the above procedure, an organic EL device is produced. In FIGS. 1 and 2-3, the first sealing film 31 and the second sealing film 32 formed by different methods are drawn in isolation. However, in actuality, these films are composed of the same materials, so that the distinct borders shown in these figures do not necessarily exist.

In the above embodiment, the first sealing film having a predetermined thickness is formed by the facing target sputtering method, and then the second sealing film composed of the same material as the first sealing film is formed by any method achieving a faster film formation rate than the facing target sputtering method, whereby damage to the organic EL element 20 caused during film formation can be reduced.

Figure 41:
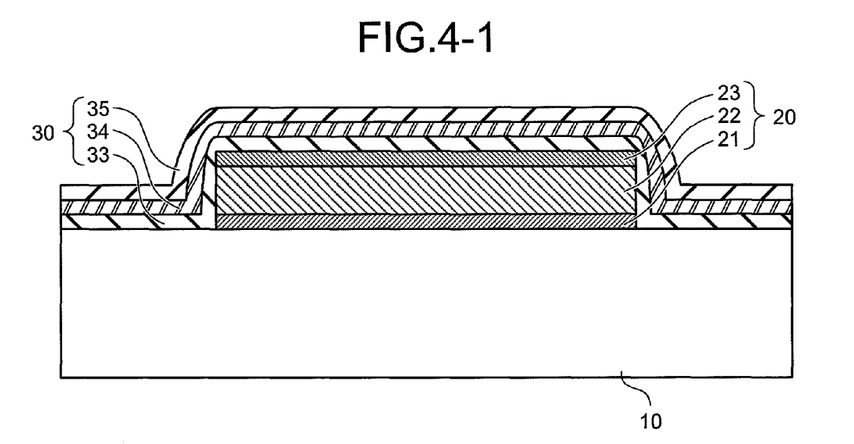
Figure 42:
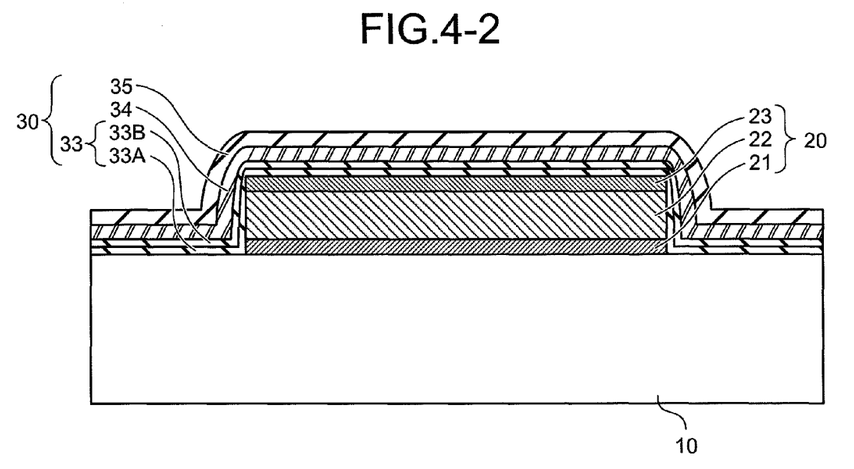
Figure 43:
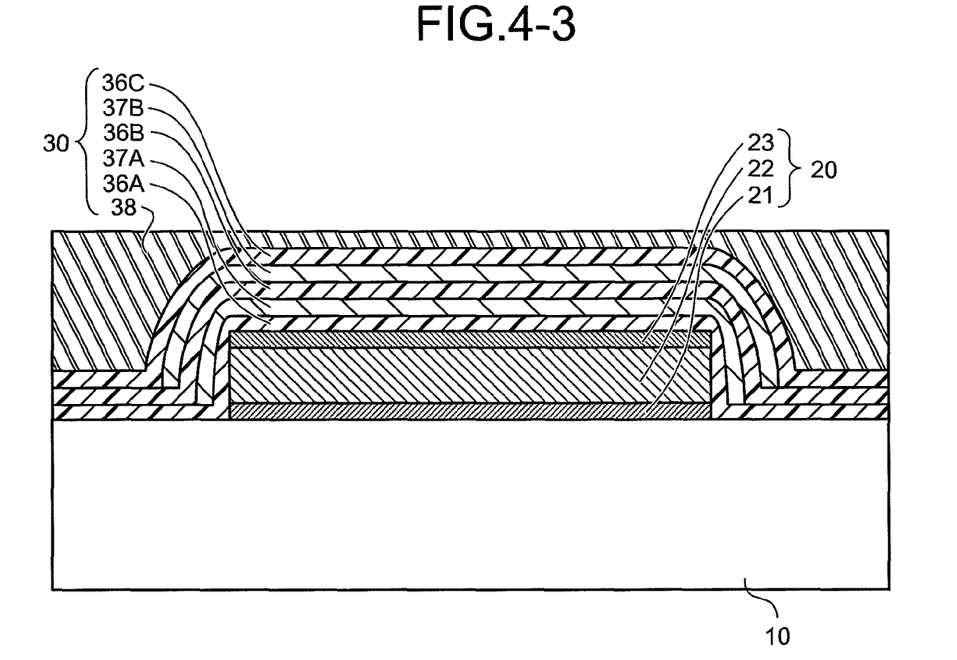

In the above embodiment, the sealing layer 30 composed of a single material is formed by different methods. The present invention will not be limited to the embodiment, so that the formation of the sealing layer 30 may use other method. FIGS. 4-1 to 4-3 show examples of the structure of sealing layers. In these figures, same elements with those in the above figures are indicated by same reference numerals, and explanations thereof are not repeated.

FIG. 4-1 depicts a sealing layer composed of three layers of inorganic film. The sealing layer 30 has a stacked structure composed of, from the supporting substrate 10 (organic EL element 20) side, an SiN film 33, an SiO or SiON film 34, and an SiN film 35. Among them, the lowermost SiN film 33 is formed by the facing target sputtering method, and the SiO or SiON film 34 and the SiN film 35 formed thereon are formed by a method such as the CVD method or the magnetron sputtering method.

FIG. 4-2 shows a sealing layer composed of three layers of inorganic film (33 to 35) in the same manner as in FIG. 4-1. In the sealing layer 30, the lowermost SiN film 33 shown in FIG. 4-1 is composed of the first SiN film 33A formed by the facing target sputtering method and the second SiN film 33B formed by the CVD method, magnetron sputtering method or the like on the first SiN film 33A. The same elements with those in FIG. 4-1 are indicated by same numerals, and explanations thereof are not repeated.

FIG. 4-3 depicts a sealing layer having a stacked structure composed of inorganic films (36A to 36C) and organic films (37A, 37B, and 38). The sealing layer 30 comprises inorganic films 36A, 36B, and 36C, and organic films 37A and 37B, which are formed alternately in this order from the supporting substrate 10 (organic EL element 20) side, and the uppermost organic film 38 which is formed on the top inorganic film 36C. The organic films 37A, 37B, and the uppermost organic film 38 correct defects such as pinholes formed in the inorganic films 36A, 36B, and 36C, thereby improving the barrier properties. The regions of the organic films 37A and 37B should be smaller than those of the inorganic films 36A, 36B, and 36C. This is because if the edges of the organic films 37A and 37B are aligned with those of the inorganic films 36A, 36B, and 36C, the edges of the organic films 37A and 37B are exposed to outside air, and the organic films 37A and 37B deteriorate therefrom.

In order to produce the sealing layer 30 having the above structure, the lowermost inorganic film 36A is formed by the above described facing target sputtering method, the organic films 37A and 37B, and the uppermost organic film 38 are formed by a flash deposition method or the like, and the inorganic films 36B and 36C are formed by the CVD method or the magnetron sputtering method.

In the above embodiment, a top emission type organic EL device is explained. The present invention is also applicable to a bottom emission organic EL device in which light produced by the organic EL layer 22 is extracted from the supporting substrate 10 side.

The organic EL element of the present invention is useful for a planar light source, a segment display unit, or a dot matrix display unit.

According to the embodiment, the sealing layer 30, which blocks the organic EL element 20 formed on the supporting substrate 10 from ambient air, is composed of the first sealing film 31 having a predetermined thickness formed by the facing target sputtering method, and the second sealing film 32 formed thereon by CVD method or magnetron sputtering method; as a result, the sealing layer 30 can be formed without damage to the organic EL element 20. In addition, a portion of the sealing layer 30 is formed by the facing target sputtering, and the other portion is formed by the CVD method, the magnetron sputtering method or the like which achieves a high film formation rate, thus achieving higher production effectiveness than the case in which the sealing layer 30 is entirely formed by the facing target sputtering method.

EXAMPLE

The present invention is further described below with reference to the following example and comparative example, but the present invention will not be limited thereto.

Example

First, an ITO film is formed on a glass substrate as a substrate (10) by the sputtering method to give a thickness of about 150 nm, and patterned into a predetermined shape by photolithography and etching techniques, thus forming an anode 21. Subsequently, the glass substrate (10) having the anode (21) is washed with an organic solvent, an alkali detergent, and ultrapure water, dried, and then subjected to ultraviolet/ozone cleaning treatment using an ultraviolet/ozone cleaning device.

Thereafter, a suspension of poly(3,4)ethylenedioxythiophene/polystyrene sulfonic acid (Baytron (registered trademark) P TP AI 4083 (trade name), manufactured by HC Starck-V TECH) is filtered through a 0.5 μm filter, and the filtered suspension is deposited on the glass substrate (10) having the anode 21 by the spin coating method to form a film having a thickness of 70 nm. Thereafter, the glass substrate (10) is placed on a hot plate, and dried in an atmosphere at 200° C. for 10 minutes, thus forming a hole injection layer.

Thereafter, a 1.5% by weight solution of a polymer organic light-emitting material (Lumation GP1300 (trade name), manufactured by Sumation) is prepared with a mixed solvent containing xylene and anisole at 1:1. The solution is deposited on the glass substrate (10) having the hole injection layer by the spin coating method to form a film having a thickness of 80 nm, thus forming a light-emitting layer. Subsequently, the light-emitting layer in the portions of the extraction electrode and sealing areas is removed from the glass substrate (10). The glass substrate (10) is introduced into a vacuum chamber, and moved into a heating chamber. The subsequent operations are carried out in vacuo or in a nitrogen atmosphere, thus preventing the organic EL device under treatment from being exposed to air.

After the glass substrate (10) is transferred into a heating chamber, the heating chamber in the vacuum chamber is evacuated to a degree of vacuum of $1\times10^{-4}$ Pa or less, where the glass substrate (10) is heated at about 100° C. for 60 minutes. Then, the glass substrate (10) is transferred into a deposition chamber, a cathode mask is aligned with the glass substrate (10), and deposition is carried out such that a cathode 23 is formed at the extraction electrode region and the light-emitting region where light emission occurs in the organic EL device. The cathode 23 is composed of a Ba film formed by the resistance heating method in which metal Ba is heated and deposited at a deposition rate of about 2 angstroms/sec to give a film thickness of 50 angstroms, and an Al film deposited by the electron beam deposition method at a deposition rate of about 2 angstroms/sec to give a film thickness of 100 angstroms. Thereafter, the glass substrate (10) is transferred into a vacuum chamber having a facing target sputtering device. Argon and oxygen gases are introduced into the vacuum chamber, and an ITO film having a thickness of 1500 angstroms is formed by facing target sputtering method. Through the above procedure, the organic EL element 20 is formed on the glass substrate (10).

Thereafter, the sputter target in the vacuum chamber having the facing target sputtering device is changed from ITO to silicon, and argon and nitrogen gases are introduced into the vacuum chamber. Then, a silicon nitride (SiN) film is deposited by facing target sputtering method on the glass substrate (10) having the organic EL element (20) to form the first sealing film (31) having a thickness of 500 angstroms.

Thereafter, the glass substrate (10) is transferred from the vacuum chamber having the facing target sputtering device to the vacuum chamber having the plasma CVD device. Then, silane and nitrogen gases are introduced into the vacuum chamber having a plasma CVD device, and an SiN film is formed by plasma CVD method to produce a second sealing film 32 having a thickness of about 2 μm. Through the above procedure, an organic EL device is produced.

Comparative Example

For comparison with the organic EL device produced in the above described example, another organic EL device as a comparative example is produced as described below. The same procedure as the above described example is carried out until an ITO film having a thickness of 1,500 angstroms is formed by facing target sputtering method on the organic EL element (20) provided on the glass substrate (10).

Thereafter, the glass substrate (10) having the organic EL element (20) is transferred from the vacuum chamber having the facing target sputtering device to the vacuum chamber having the plasma CVD device without exposure to air. Then, silane and nitrogen gases are introduced into the vacuum chamber having the plasma CVD device, and an SiN film having a thickness of about 2 μm is formed by plasma CVD method.

The brightness of the organic EL elements (20) of the organic EL devices produced in the above described example and comparative example is measured under a voltage of 10 V; the organic EL device of the example, which includes the SiN film formed by the facing target sputtering method as a portion of the sealing layer (30), achieves higher brightness than the organic EL device of comparative example, which includes the sealing layer (30) entirely formed by the plasma CVD method.

INDUSTRIAL APPLICABILITY

As described above, the method for manufacturing an organic EL device according to the present invention is useful in blocking an organic EL element from water vapor and other gases.

The invention claimed is:

1. A method for manufacturing an organic electroluminescence device composed of a supporting substrate and an organic electroluminescence element mounted thereon, the organic electroluminescence element being enclosed with the supporting substrate and a sealing layer including at least a first inorganic film and a second inorganic film configured to be cut off from the outside, the method comprising:
   forming the first inorganic film by a facing target sputtering method configured to cover an exposed surface of the organic electroluminescence element mounted on the supporting substrate; and
   forming the second inorganic film by a film formation method that is different from and achieves a higher film formation rate than the facing target sputtering method to further cover the first inorganic film after the formation of the first inorganic film, wherein the second inorganic film is made from the same material as the first inorganic film.

2. The method for manufacturing an organic electroluminescence device according to claim 1, wherein the film formation method different from the facing target sputtering method is a CVD method or a magnetron sputtering method.

3. The method for manufacturing an organic electroluminescence device according to claim 2, wherein the first inorganic film is formed in a thickness of at least 50 nm.

4. The method for manufacturing an organic electroluminescence device according to claim 1, wherein the first inorganic film is formed in a thickness of at least 50 nm.

* * * * *